(12) United States Patent
Terada et al.

(10) Patent No.: US 9,643,155 B2
(45) Date of Patent: May 9, 2017

(54) ABSORBENT LAMINATE PROVIDED WITH ABSORBENT FILM, ELECTRONIC DEVICE CONTAINING SAME, AND METHOD FOR PRODUCING SAME

(71) Applicant: KYODO PRINTING CO., LTD., Tokyo (JP)

(72) Inventors: Akira Terada, Tokyo (JP); Tatsuya Ogawa, Tokyo (JP); Naoki Ogawa, Tokyo (JP); Yuki Narita, Tokyo (JP); Makoto Kato, Tokyo (JP)

(73) Assignee: KYODO PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/021,126

(22) PCT Filed: Sep. 10, 2014

(86) PCT No.: PCT/JP2014/073916
§ 371 (c)(1),
(2) Date: Mar. 10, 2016

(87) PCT Pub. No.: WO2015/037612
PCT Pub. Date: Mar. 19, 2015

(65) Prior Publication Data
US 2016/0220979 A1    Aug. 4, 2016

(30) Foreign Application Priority Data

Sep. 10, 2013  (JP) .................. 2013-187748
Jul. 17, 2014   (JP) .................. 2014-147209

(51) Int. Cl.
| | | |
|---|---|---|
| B01J 20/32 | (2006.01) | |
| B01J 20/18 | (2006.01) | |
| B01D 53/28 | (2006.01) | |
| B32B 17/10 | (2006.01) | |
| B32B 27/32 | (2006.01) | |
| B01J 20/02 | (2006.01) | |
| B01J 20/04 | (2006.01) | |
| B01J 20/08 | (2006.01) | |
| B01J 20/12 | (2006.01) | |
| B01J 20/20 | (2006.01) | |
| B01J 20/26 | (2006.01) | |
| B01J 20/28 | (2006.01) | |
| H01L 51/00 | (2006.01) | |
| B01J 20/10 | (2006.01) | |
| B01D 53/26 | (2006.01) | |
| B32B 15/08 | (2006.01) | |
| B32B 27/08 | (2006.01) | |
| B32B 27/20 | (2006.01) | |

(Continued)

(52) U.S. Cl.
CPC ............ *B01J 20/18* (2013.01); *B01D 53/261* (2013.01); *B01D 53/28* (2013.01); *B01J 20/0211* (2013.01); *B01J 20/0281* (2013.01); *B01J 20/041* (2013.01); *B01J 20/045* (2013.01); *B01J 20/08* (2013.01); *B01J 20/103* (2013.01); *B01J 20/12* (2013.01); *B01J 20/20* (2013.01); *B01J 20/261* (2013.01); *B01J 20/2803* (2013.01); *B01J 20/28035* (2013.01); *B01J 20/3214* (2013.01); *B32B 9/005* (2013.01); *B32B 9/045* (2013.01); *B32B 15/08* (2013.01); *B32B 17/10* (2013.01); *B32B 27/08* (2013.01); *B32B 27/20* (2013.01); *B32B 27/32* (2013.01); *B32B 27/36* (2013.01); *H01L 51/0024* (2013.01); *B32B 2264/102* (2013.01); *B32B 2264/108* (2013.01); *B32B 2307/726* (2013.01); *B32B 2457/00* (2013.01); *H01L 51/5259* (2013.01); *Y02E 10/549* (2013.01); *Y02P 70/521* (2015.11)

(58) Field of Classification Search
CPC .................................. B01J 20/32; B01J 20/26
USPC ......................................... 502/402, 439, 526
See application file for complete search history.

(56) References Cited

U.S. PATENT DOCUMENTS 7,743,642 B2  6/2010  Chiba
8,421,351 B2  4/2013  Kanazawa et al.
(Continued)

FOREIGN PATENT DOCUMENTS

CN    1890014 A    1/2007
CN   101128945 A   2/2008
(Continued)

OTHER PUBLICATIONS

International Search Report for PCT/JP2014/073916 dated Dec. 16, 2014.
English Abstract of JP2002206046, Publication Date: Jul. 26, 2002.
English Abstract of JP2006116501, Publication Date: May 11, 2006.
English Abstract of JP2001321631, Publication Date: Nov. 20, 2001.
English Abstract of JP55044344, Publication Date: Mar. 28, 1980.
English Abstract of JP2002043055, Publication Date: Feb. 8, 2002.
(Continued)

*Primary Examiner* — Edward Johnson
(74) *Attorney, Agent, or Firm* — Millen, White, Zelano and Branigan, P.C.

(57) ABSTRACT

An absorbent film and a substrate having extremely simple production without having an adhesive layer that can generate volatile components. The absorbent laminate contains a substrate, which has an inorganic material or a low-thermal-contraction organic material, and an absorbent film on the surface of the substrate. The organic material of the substrate has a rate of thermal contraction in the direction of conveyance thereof when performing hot pressing by means of a heating roller under the conditions of 140° C., a roller pressure of 0.1 MPa, and a conveyance speed of 0.4 m/min of less than 0.6%. The absorbent film has an absorbent layer adhered to the surface of the substrate without an adhesive layer therebetween and containing less than 87 vol % and at least 25 vol % of a thermoplastic resin binder and over 13 vol % and no greater than 75 vol % of an inorganic absorption agent.

12 Claims, 1 Drawing Sheet

(51) Int. Cl.
*B32B 9/00* (2006.01)
*B32B 9/04* (2006.01)
*B32B 27/36* (2006.01)
*H01L 51/52* (2006.01)

(56) References Cited

U.S. PATENT DOCUMENTS

2008/0193704 A1    8/2008   Ogawa
2009/0174304 A1    7/2009   Kanazawa et al.

FOREIGN PATENT DOCUMENTS

| | | |
|---|---|---|
| JP | 55044344 A | 3/1980 |
| JP | 2001321631 A | 11/2001 |
| JP | 2002043055 A | 2/2002 |
| JP | 2002206046 A | 7/2002 |
| JP | 20055243556 A | 9/2005 |
| JP | 2006116501 A | 5/2006 |
| JP | 2007000817 A | 1/2007 |
| WO | 2007123039 A1 | 11/2007 |

OTHER PUBLICATIONS

English Abstract of JP2005243556, Publication Date: Sep. 8, 2005.
English machine translation of JP2007000817A published on Jan. 11, 2007 to Yokoi Noriaki of Nippon Micro Coating KK.
Search report in corresponding CN application 100013 issued on Nov. 1, 2016.

ABSORBENT LAMINATE PROVIDED WITH ABSORBENT FILM, ELECTRONIC DEVICE CONTAINING SAME, AND METHOD FOR PRODUCING SAME

TECHNICAL FIELD

The present invention relates to an absorbent laminate provided with an absorbent film, an electronic device containing the same, and a method for producing the same. More particularly, the present invention relates to an absorbent laminate containing a substrate and an absorbent film, the substrate and absorbent film being adhered with high adhesive strength without having an adhesive layer there between.

BACKGROUND ART

A typical example of an electronic device in the form of an organic EL device is known to have the problem of the formation of so-called dark spots (non-light-emitting areas) caused by incursion of moisture into an organic EL element. In addition, since the power generation cells and conducting wires of solar cell elements are deteriorated by moisture, they are known to have the problem of undergoing a decrease in power generation efficiency over time. Therefore, absorbent materials and the like are used in these devices in order to absorb moisture.

Methods for incorporating absorbent materials or adsorbent materials in these devices are known in the prior art, such as a method for laminating an absorbent material with an adhesive or adhesive tape and the like, or a method for inserting an absorbent material into a device by countersinking in a sealing plate, in the manner of Patent Documents 1 to 4. Examples of adhesive layers used in these adhesives or adhesive tape include layers composed of polyurethane-based adhesive, acrylic resin-based adhesive, epoxy resin-based adhesive or silicone resin-based adhesive.

However, when using a method consisting of laminating an absorbent material as described above, there is the potential for volatile components such as solvents contained in the adhesive or adhesive tape to have a detrimental effect on an EL element or other module. More specifically, there are cases in which the material that composes each layer, namely the material of the luminescent layer in an EL element in particular, may deteriorate as a result of reacting with a volatile component. In an EL element, this may have a detrimental effect such as causing a decrease in luminous efficiency due to the formation of dark spots.

In addition, in the method consisting of inserting an absorbent material by countersinking in a sealing plate, in addition to an increase in processing costs, there are also restrictions on the device design.

PRIOR ART DOCUMENTS

Patent Documents

Patent Document 1: Japanese Unexamined Patent Publication No. 2001-277395
Patent Document 2: Japanese Unexamined Patent Publication No. 2002-280166
Patent Document 3: International Publication No. WO 2006/088179
Patent Document 4: Japanese Unexamined Patent Publication No. 2010-201630

DISCLOSURE OF THE INVENTION

Problems to be Solved by the Invention

Therefore, an object of the present invention is to provide an absorbent laminate in which an absorbent film for absorbing moisture and the like is adhered to a substrate without using an adhesive layer composed of an adhesive or adhesive tape in the manner previously described.

Means for Solving the Problems

The inventors of the present invention found that an absorbent laminate having the configuration indicated below enables a substrate and absorbent film to be adhered unexpectedly strongly even without having an adhesive layer between the substrate and absorbent film. Namely, the present invention is as indicated below.

(1) An absorbent laminate containing a substrate, having an inorganic material or a low-thermal-contraction organic material on the surface thereof, and an absorbent film on the surface of the substrate,
  wherein the organic material of the substrate has a coefficient of thermal contraction in the direction of conveyance of less than 0.6% when it is hot pressed with a heating roller under conditions of 140° C., a roller pressure of 0.1 MPa and a conveyance speed of 0.4 m/min, and
  wherein the absorbent film is adhered to the surface of the substrate without having an adhesive layer there between, and has an absorbent layer containing less than 87 vol % to 25 vol % or more of a thermoplastic resin binder and more than 13 vol % to 75 vol % or less of an inorganic absorption agent.

(2) An absorbent laminate in which the surface of a substrate having an inorganic material or low-thermal-contraction organic material on the surface thereof and an absorbent film are adhered by thermocompression bonding treatment without having an adhesive layer there between,
  wherein the organic material has a coefficient of thermal contraction in the direction of conveyance of less than 0.6% when it is hot pressed with a heating roller at the same temperature as that of the thermocompression bonding treatment under conditions of a roller pressure of 0.1 MPa and a conveyance speed of 0.4 m/min, and
  wherein the absorbent film has an absorbent layer containing less than 87 vol % to 25 vol % or more of a thermoplastic resin binder and more than 13 vol % to 75 vol % or less of an inorganic absorption agent.

(3) The absorbent laminate described in (1) or (2), wherein the surface of the substrate contains a material selected from the group consisting of polyethylene terephthalate, glass, iron and alloys thereof, aluminum and alloys thereof and copper and alloys thereof.

(4) The absorbent laminate described in any of (1) to (3), wherein the surface of the substrate has glass or metal, and the absorbent layer contains less than 87 vol % to 50 vol % or more of a thermoplastic resin binder and more than 13 vol % to 50 vol % or less of a chemical adsorbent.

(5) The absorbent laminate described in any of (1) to (3), wherein the inorganic absorption agent is selected from the group consisting of calcium oxide, magnesium oxide, barium oxide, calcium sulfate, titanium sulfate, alumina, aluminum oxide, magnesium silicate, quicklime, silica gel, aluminosilicate minerals, clay, porous glass, microporous activated carbon, zeolite, activated carbon and mixtures thereof.

(6) The absorbent laminate described in any of (1) to (5), wherein the thermoplastic resin binder is a polyolefin-based resin.

(7) The absorbent laminate described in any of (1) to (6), wherein the absorbent film has a skin layer composed of a resin and having a thickness of 60 μm or less on the substrate side of the absorbent layer.

(8) A method for producing an absorbent laminate, containing a substrate having an inorganic material and low-thermal-contraction organic material on the surface thereof and an absorbent film on the surface of the substrate, comprising:

providing the substrate, providing an absorbent composition containing less than 87 vol % to 25 vol % or more of a thermoplastic resin binder and more than 13 vol % to 75 vol % or less of an inorganic absorption agent, and obtaining the absorbent film by forming the absorbent composition and thermocompression bonding the absorbent film to the surface of the substrate without having an adhesive layer there between;

wherein the organic material has a thermal compression rate in the direction of conveyance of less than 0.6% when it is hot pressed with a heating roller at the same temperature as that of the thermocompression bonding under conditions of a roller pressure of 0.1 MPa and a conveyance speed of 0.4 m/min.

(9) The method for producing an absorbent laminate described in (8), wherein the substrate contains a material selected from the group consisting of polyethylene terephthalate, glass, iron and alloys thereof, aluminum and alloys thereof and copper and alloys thereof, the thermoplastic resin binder is a polyolefin-based resin, and the inorganic absorption agent is selected from calcium oxide, zeolite and mixtures thereof.

(10) A method for producing a laminate, containing a substrate having glass or metal on the surface thereof and an absorbent film, comprising:

providing the substrate having glass or metal on the surface thereof, providing an absorbent composition containing less than 87 vol % to 25 vol % or more of a thermoplastic resin binder and more than 13 vol % to 75 vol % or less of an inorganic absorption agent, and obtaining the absorbent film by forming the absorbent composition and thermocompression bonding the absorbent film to the substrate.

(11) An electronic device containing the absorbent laminate described in any of (1) to (7).

(12) The electronic device described in (11), which is an organic EL module, an inorganic EL module or a solar cell.

Effects of the Invention

According to the present invention, an absorbent laminate containing a substrate and an absorbent film can be provided that does not have an adhesive layer capable of generating volatile components and can be produced extremely easily.

BRIEF DESCRIPTION OF THE DRAWINGS

FIG. 1(A) shows the absorbent laminate of the present invention in which a substrate and an absorbent film are directly adhered without having an adhesive layer there between. FIG. 1(B) shows the absorbent laminate of the present invention in which a substrate and an absorbent film are directly adhered without having an adhesive layer there between, wherein the absorbent film has a multilayer structure having a polyolefin-based skin layer on both sides of an absorbent layer.

BEST MODE FOR CARRYING OUT THE INVENTION

<Absorbent Laminate>

The absorbent laminate of the present invention contains a substrate having an organic material or a low-thermal-contraction organic material on the surface thereof, and an absorbent film adhered to the surface of the substrate without having an adhesive layer there between. The absorbent film has an absorbent layer containing less than 87 vol % to 25 vol % or more of a thermoplastic resin binder and more than 13 vol % to 75 vol % or less of an inorganic absorption agent.

Figure 1:
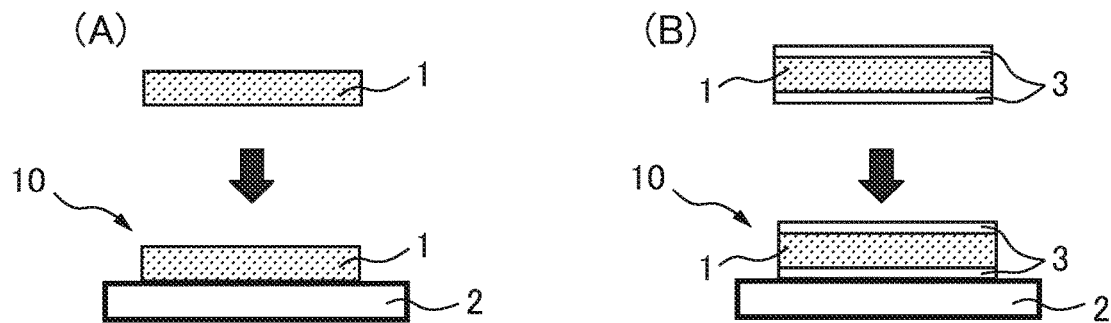

FIG. 1(A) shows the absorbent laminate 10 of the present invention in which an absorbent film composed only of an absorbent layer 1 is directly adhered to the surface of a substrate 2 without having an adhesive layer there between. FIG. 1(B) shows the absorbent laminate 10 of the present invention in which an absorbent film composed only of the absorbent layer 1 is directly adhered to the surface of the substrate 2 without having an adhesive layer there between, and the absorbent film is composed of a multilayer structure having a skin layer 3 composed of a polyolefin-based resin on both sides of the absorbent layer 1.

In the absorbent laminate of the present invention, the substrate and the absorbent film can be adhered by thermocompression bonding (thermal fusion bonding). This type of absorbent laminate is useful since it can be produced extremely easily and does not have an adhesive layer for which there is the risk of generation of contaminants. Moreover, since the absorbent film used in the present invention does not undergo a significant decrease in absorbency even if subjected to thermocompression bonding, the absorbent laminate of the present invention retains high absorbency.

The substrate and absorbent film are adhered even without having an adhesive layer there between. Adhesive strength (peel strength) between the substrate and the absorbent film in the case of measuring in compliance with the 180 degree sign peel test according to JIS K6854-2 is preferably 0.01 N/15 mm or more, 0.1 N/15 mm or more, 0.5 N/15 mm or more, 1.0 N/15 mm or more, 2.0 N/15 mm or more, 3.0 N/15 mm or more or 4.0 N/15 mm or more. If adhered at this strength, in the case of using the absorbent laminate of the present invention in an electronic device, for example, there is no occurrence of separation of the absorbent film during conveyance or other steps in the device assembly process, thereby making this preferable.

In the absorbent laminate of the present invention, the substrate and the absorbent film are not adhered by ordinary heat-sealing. Here, adhesion by normal heat-sealing refers to a state in which the surfaces of the substrate and absorbent film are entangled at the molecular level.

A film consisting only of a substrate surface having low thermal contraction and a thermoplastic resin binder not containing an absorption agent surprisingly did not adhere at all even when subjected to thermocompression bonding. The inventors of the present invention found that only a film containing specific amounts of an absorption agent and thermoplastic resin binder adhered to the substrate surface having low thermal contraction. Without being bound by theory, the reason for the substrate and absorbent film of the absorbent laminate of the present invention strongly adhering without having an adhesive layer there between is thought to be as follows. First, when the absorbent film is placed on the surface of the low-thermal-contraction substrate and treated by thermocompression bonding, since the absorbent film expands and contracts due to heat more easily than the substrate surface, the absorbent film contracts by a process in which it temporarily elongates during thermocompression bonding and is subsequently cooled. At that time, since the entire film simultaneously contracts significantly in the case of a film consisting of a thermoplastic resin binder only, it does act in the manner of a suction pad, thereby preventing it from adhering to the substrate, and ends up separating from the substrate even if it is temporarily adhered. On the other hand, in an absorbent film containing a specific amount of an inorganic absorption agent, the absorption agent fulfills the role of a kind of framework, and as a result of the spaces within the framework partially contracting, a suitable degree of thermal contraction results, and this is thought to allow the absorbent film to stick to the substrate in the manner of a suction pad.

Figure 2:
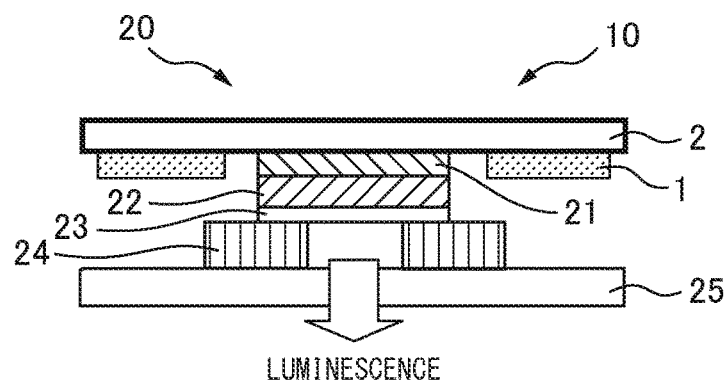
FIG. 2 is a schematic diagram of an EL element that is able to use the absorbent laminate of the present invention.

The absorbent laminate of the present invention can be used in an electronic device, and can be used in, for example, an organic EL, inorganic EL or solar cell. FIG. 2 shows a schematic diagram of an EL element 20 that uses the absorbent laminate 10 of the present invention in which a metal electrode 21, an EL layer (luminescent layer) 22 and a transparent electrode 23 are formed in that order on the absorbent laminate 10 containing an absorbent film 1 and the substrate 2, and a TFT 24 is positioned between the transparent electrode 23 and a transparent electrode 25.

A solar cell contains on the incident light side thereof a transparent substrate, a power generation cell, a conducting wire for connecting the power generation cell with the outside and a sealing resin for sealing the power generation cell and conducting wire, and contains a moisture resistant back sheet on the side opposite from the transparent substrate, the absorbent laminate of the present invention being able to serve as a portion of the back sheet.

In this type of electronic device, since the presence of moisture or contaminants within the device leads to a decrease in characteristics, the absorbent laminate of the present invention is particularly useful since does not have an adhesive layer capable of generating contaminants while also absorbing moisture. In addition, since the absorbent film used in the absorbent laminate of the present invention is comparatively thin and flexible, it is more advantageous than conventionally used moisture getter materials for EL applications.

The thickness of the absorbent laminate can be, for example, 20 mm or less, 10 mm or less or 1 mm or less. In addition, the dimension of one side of the absorbent laminate in the horizontal direction can be, for example, 100 cm or less, 50 cm or less, 30 cm or less or 20 cm or less.

(Substrate)

There are no particular limitations on the substrate used in the laminate of the present invention provided it is a substrate that has an inorganic material or low-thermal-contraction organic material on the surface thereof. However, the surface of the substrate is preferably not subjected to surface treatment for enhancing separation such as coating with a silicone resin or fluorine resin. Here, the low-thermal-contraction organic material refers to an organic material in which the coefficient of thermal contraction in the direction of conveyance is less than 0.6% in the case of measuring the amount of thermal contraction in the same manner as Experiment C of the examples by performing hot pressing with a heating roller on a film composed of the organic material only and having a thickness of 12 μm to 100 μm under conditions of 140° C., a roller pressure of 0.1 MPa and a conveyance speed of 0.4 m/min. The coefficient of thermal contraction of the material used for the substrate surface is preferably 0.4% or less, 0.2% or less or 0.1% or less.

In the present invention, the substrate having an inorganic material or low-thermal-contraction organic material on the surface thereof is a substrate that can be adhered to the absorbent film by thermocompression bonding. For example, in one mode of the present invention that uses a single layer substrate composed of a low-thermal-contraction organic material, the coefficient of thermal contraction in the direction of conveyance of the substrate is less than 0.6% in the case of thermocompression bonding the absorbent film and substrate with a heating roller under conditions of a roller temperature of 140° C., a roller pressure of 0.1 MPa and a conveyance speed of 0.4 m/min in the same manner as in Experiment B1-2 of the examples.

Examples of the material of the surface of the substrate as previously described include inorganic materials such as pure metals, inorganic compounds, alloys, inorganic oxides and metal oxides, and include materials selected from the group consisting of glass, iron and alloys thereof (such as stainless steel), aluminum and alloys thereof and copper and alloys thereof. Glass can be used provided it has the composition of ordinary glass, and specific examples of glass that can be used include soda lime glass, aluminosilicate glass and alkali-free glass.

Moreover, the surface of the substrate used in the absorbent laminate of the present invention may be an organic material having low thermal contraction, a thermoplastic resin or thermosetting resin, for example, can be used, and specific examples thereof include polyester (such as polyethylene terephthalate or polypropylene terephthalate), polyamide, epoxy resin, phenol resin, polycarbonate, ABS resin and vinyl chloride resin.

A composite film obtained by laminating aluminum foil or copper foil and the like on the surface of a resin such as PET can also be used for the substrate used in the absorbent laminate of the present invention. In addition, the material of the aforementioned substrate surface can also be used as a single layer substrate. A composite body containing an inorganic material for the aforementioned substrate surface may also be used on the surface of a film or other molded resin. Moreover, a substrate containing an organic material for the aforementioned substrate surface may also be used on the surface of a metal body such as aluminum foil, or may be a composite body obtained by laminating a plurality of organic materials.

For example, a thermoplastic resin film at least having a deposited layer of a metal, metalloid or oxide thereof or a halogenated polymer layer can be used for the substrate. Here, a metalloid refers to boron, silicon, germanium, arsenic, antimony and tellurium. In addition, examples of the deposited layer of a metal, metalloid or oxide thereof include an aluminum-deposited film, silica-deposited film, alumina-deposited film or silica-aluminum binary deposited film, while examples of the halogenated polymer layer include a polyvinylidene chloride coating film and polyvinylidene fluoride coating film. Examples of resin films obtained by deposition thereof include polyolefin-based resins (and particularly oriented and non-oriented polypropylene), polyvinyl chloride, saturated polyesters (such as polyethylene terephthalate (PET) or polybutylene terephthalate) and polyamides (such as Nylon, Nylon 6 or Nylon MXD6).

In an electronic device, the substrate fulfills the role of a sealing material that isolates the inside of the device from the outside, and glass having high gas impermeability or a composite film containing aluminum or other metal layer is used preferably.

(Absorbent Film)

The absorbent film used in the absorbent laminate of the present invention has an absorbent layer containing less than 87 vol % to 25 vol % or more of a thermoplastic resin binder and more than 13 vol % to 75 vol % or less of an inorganic absorption agent. This film can be composed of an absorbent layer only or can be composed as a multilayer film that includes an absorbent layer. The absorbent film can be forming by T-die extrusion or tubular film process by dispersing the inorganic absorption agent in the thermoplastic resin binder followed by melt extrusion or co-extrusion.

The thickness of the absorbent film is preferably 10 μm or more, 20 μm or more or 30 μm or more and 300 μm or less, 200 μm or less or 150 μm or less. In addition, corona treatment can be performed on this absorbent film for the purpose of improving adhesiveness by modifying or cleaning the surface.

The thermoplastic resin binder contained in this absorbent layer can compose 25 vol % or more, 30 vol % or more, 40 vol % or more or 50 vol % or more and 87 vol % or less, 85 vol % or less or 80 vol % or less of the absorbent layer. In addition, this thermoplastic resin binder preferably composes 25 wt % or more, 30 wt % or more or 40 wt % or more or preferably composes 70 wt % or less, 65 wt % or less or 60 wt % or less of the absorbent layer.

The inorganic absorption agent contained in this absorbent layer can compose more than 13 vol %, 15 vol % or more or 20 vol % or more and 75 vol % or less, 70 vol % or less, 60 vol % or less or 50 vol % or less of the absorbent layer. This inorganic absorption agent preferably composes 30 wt % or more, 35 wt % or more or 40 wt % or more and preferably composes 75 wt % or less, 70 wt % or less or 60 wt % or less of the absorbent layer. The substrate and absorbent film adhere sufficiently strongly if within the aforementioned ranges. Moreover, a film can be provided that has favorable moldability and suitable moisture absorption performance.

The melt mass flow rate (MFR) of the thermoplastic resin binder in the case of measuring in compliance with JIS K7210 under conditions of a temperature of 190° and load of 2.16 kg is preferably 5 g/10 min or more, 10 g/10 min or more or 20 g/10 min or more. In the case the thermoplastic resin binder has a melting point, the melting point thereof is preferably 80° C. or higher or 100° C. or higher and 180° C. or lower or 150° C. or lower. In this case, melting point is measured at 10° C./min with a differential scanning calorimeter (DSC) in compliance with JIS K6922-2 (ISO1872-2).

A polyolefin-based resin can be used for the thermoplastic resin binder, and a polyethylene- or polypropylene-based resin can be used preferably. Here, examples of polyethylene-based resins include low density polyethylene (LDPE), linear low density polyethylene (LLDPE), medium density polyethylene (MDPE), high density polyethylene (HDPE), ethylene-acrylic acid copolymer (EAA), ethylene-methacrylic acid copolymer (EMAA), ethylene-ethyl acrylate copolymer (EEA), ethylene-methyl acrylate copolymer (EMA), ethylene-vinyl acetate copolymer (EVA), carboxylic acid-modified polyethylene, carboxylic acid-modified ethylene-vinyl acetate copolymer, derivatives thereof and mixtures thereof.

Examples of polypropylene-based resins include polypropylene homopolymer (PP), random polypropylene (random PP), block polypropylene (block PP), chlorinated polypropylene, carboxylic acid-modified polypropylene, derivatives thereof and mixtures thereof.

In the case of calculating the volume percentage of the inorganic absorption agent contained in the absorbent layer and the specific gravity of the inorganic absorption agent is uncertain, the specific gravity of that layer may be determined by measurement followed by determining the volume percentage of the inorganic absorption agent from that measured value, the weights of inorganic absorption agent and thermoplastic resin added and the specific gravity of the thermoplastic resin. For example, in the case the specific gravity of a layer formed using 50 g of an inorganic absorption agent and 50 g of a thermoplastic resin having a specific gravity of 0.90 g/cm$^3$ is 1.10 g/cm$^3$, hen the specific gravity of the inorganic absorption agent contained in that layer can be calculated to be 1.41 g/cm$^3$, and the inorganic absorption agent can be said to be present in that layer at 38.9 vol %.

Examples of such an inorganic absorption agent include physical adsorption agents, chemical adsorption agents and combinations thereof. Examples of physical adsorption agents include alumina, aluminum oxide, magnesium silicate, quicklime, silica gel and inorganic molecular sieves. There are no particular limitations on the inorganic molecular sieve, and examples thereof include aluminosilicate minerals, clay, porous glass, microporous activated carbon, zeolite, activated carbon and compounds having an opening structure allowing diffusion of water and other small molecules.

Natural zeolite, artificial zeolite or synthetic zeolite can be used for the zeolite. Zeolite is a particulate substance that is used to separate substances according to differences in their molecular size, and since it has a structure having uniform pores and has the action of a type of sieve by absorbing small molecules that enter voids within the pores, it is able to absorb water (steam, water vapor) or organic gases and the like. An example of synthetic zeolite is a molecular sieve, and molecular sieves having a pore diameter (absorption opening) of 0.3 nm to 1 nm can be used in particular. Normally, molecular sieves having a pore diameter of 0.3 nm, 0.4 nm, 0.5 nm and 1 nm are referred to as molecular sieve 3A, molecular sieve 4A, molecular sieve 5A and molecular sieve 13X, respectively.

Examples of chemical adsorption agents include moisture-absorbing chemical absorption agents (chemical adsorbents), and other ordinary chemical adsorbents can also be used. Specific examples thereof include calcium oxide, barium oxide, magnesium oxide, lithium sulfate, sodium sulfate, calcium sulfate, magnesium sulfate, cobalt sulfate, gallium sulfate, titanium sulfate and nickel sulfate, with calcium oxide being particularly preferable.

A skin layer can be provided in the absorbent film on at least one side of the absorbent layer for the purpose of adjusting absorption rate and/or for the purpose of improving handling ease of the absorbent laminate during production or use. This skin layer can be formed from a resin selected from a polyolefin-based resin (and particularly polyethylene-based resin or polypropylene-based resin), saturated or unsaturated polyester, polyvinyl chloride, polystyrene, derivatives thereof and mixtures thereof.

The melt mass flow rate (MFR) of the resin used in the skin layer is preferably 0.1 g/10 min or more, 0.5 g/10 min or more, 1.0 g/10 min or more or 3.0 g/10 min or more and 50 g/10 min or less, 20 g/10 min or less or 10 g/10 min or less in the case of measuring in compliance with JIS K7210 under conditions of a temperature of 190° C. and load of 2.16 kg. In the case the resin used in the skin layer has a melting point, the melting point thereof is preferably 100° C. or higher or 120° C. or higher and 200° C. or lower or 150° C. or lower. In this case, melting point is measured at 10° C./min with a differential scanning calorimeter (DSC) in compliance with JIS K6922-2 (ISO1872-2).

In the case a skin layer is present on the substrate side of the absorbent layer in the absorbent film, the thickness thereof is preferably 60 μm or less and more preferably 30 μm or less for the purpose of ensuring adhesive strength between the absorbent film and substrate. In the case a skin layer is present on the opposite side from the substrate side on both sides of the absorbent layer in the absorbent film, although there are no particular limitations on the thickness thereof, it is preferably 100 μm or less in order to ensure an adequate absorption rate.

Although the absorbent film normally expands after absorbing an absorbed substance, in the case of using a chemical adsorbent as an absorption agent, the coefficient of area expansion can be reduced even after absorption in the case of thermocompression bonding to the substrate, thereby preventing the absorbent film from peeling from the substrate. In this case, the absorbent film substantially expands in the direction of thickness only.

<Method for Producing Absorbent Laminate>

The method for producing an absorbent laminate of the present invention comprises providing a substrate having an inorganic material or low-thermal-contraction organic material on the surface thereof; providing an absorbent composition containing less than 87 vol % to 25 vol % or more of a thermoplastic resin binder and more than 13 vol % to 75 vol % or less of an inorganic absorption agent; and/or obtaining an absorbent film by forming the absorbent composition followed by thermocompression bonding the absorbent film to the surface of the substrate. This production method does not include a step of forming an adhesive layer that adheres the substrate and absorbent film.

Figure 3:
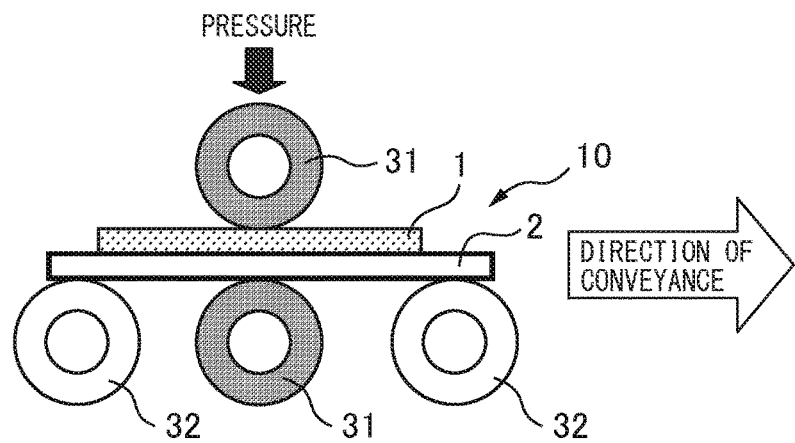
FIG. 3 shows one step of the production method of the present invention in which an absorbent laminate is produced by laminating a substrate and an absorbent film by thermocompression bonding.

Here, in the step of thermocompression bonding the absorbent film to the surface of the substrate, as shown in FIG. 3, the absorbent film 1 and the substrate 2 can be superimposed and thermocompression bonded with a heating roller 31 while conveying with conveyance rollers 32. In this thermocompression bonding step, although the substrate and absorbent film are only required to be minimally adhered, the substrate and absorbent film are preferably thermocompression bonded so that the adhesive strength (peel strength) thereof in the case of measuring in compliance with the 180 degree sign peel test according to JIS K6854-2 is 0.01 N/15 mm or more, 0.1 N/15 mm or more, 0.5 N/15 mm or more, 1.0 N/15 mm or more, 2.0 N/15 mm or more, 3.0 N/15 mm or more or 4.0 N/15 mm or more.

For example, the temperature of the heating roller can be 100° C. or higher, 120° C. or higher or 140° C. or higher and 200° C. or lower, 180° C. or lower or 160° C. or lower corresponding to the thermal properties of the thermoplastic resin binder of the absorbent film used. In addition, the roller pressure can be 0.05 MPa or more, 0.1 MPa or more or 0.3 MPa or more and 1.0 MPa or less, 0.8 MPa or less or 0.5 MPa or less. The conveyance speed can be 0.01 m/min or more, 0.05 m/min or more or 0.1 m/min or more and 20 m/min or less, 10 m/min or less or 5 m/min or less. In the case the absorbent film is composed only of an absorbent layer, the temperature of the heating roller is preferably equal to or higher than the melting point of the binder resin contained in the absorbent layer. In the case a skin film is present on the substrate side of the absorbent layer in the absorbent film, the temperature of the heating roller is preferably equal to or higher than the melting point of the binder resin contained in the absorbent layer and equal to or higher than the melting point of the skin layer resin, and the roller pressure is also preferably comparatively high. This is thought to be done so that the inorganic absorption agent extends to the surface portion of the softened skin layer by treating at high temperature and high pressure.

EXAMPLES

Experiment A: Absorbent Laminates Having Absorbent Layer Using Calcium Oxide as Inorganic Absorption Agent A1. Fabrication of Absorbent Laminates A1-1. Fabrication of Single Absorbent Layer Absorbent Film A thermoplastic resin binder in the form of LDPE (Petrothene 202R, Tosoh Corp., melt mass flow rate: 24 g/10 min, melting point: 106° C., density: 0.918 g/cm$^3$) and a moisture-absorbing chemical adsorbent in the form of calcium oxide (density: 3.35 g/cm$^3$) were kneaded so that the calcium oxide content ranged from 0 wt % to 70 wt % (namely, 0 vol % to 64 vol % based on the binder and 0 vol % to 39 vol % based on the entire composition) to obtain an absorbent composition. Kneading was performed using a Labo Plastomill (Toyo Seiki Seisaku-sho, Ltd.). This was then formed into a film with a T-die to a thickness of 60 μm to obtain a single absorbent layer absorbent film.

A1-2. Fabrication of Absorbent Film having 3-Layer Structure Provided With Skin Layers on Both Sides of Absorbent Layer A film was formed with a T-die by three-layer co-extrusion so as to provide a skin layer on both sides of an absorbent layer using an absorbent composition obtained using the same method as 1-1 for the absorbent layer, and using LLDPE (Evolue SP2520 Prime Polymer Co., Ltd., melting point: 122° C., melt mass flow rate: 1.9 g/10 min, density: 0.925 g/cm$^3$) for the skin layer. The thickness of the absorbent layer was 60 μm and the thickness of the skin layer on both sides was 10 μm for both layers.

A1-3. Thermocompression Bonding to Substrate

The absorbent film fabricated in 1-1 or 1-2 was cut to a size of 10 cm×10 cm, and then placed on a glass substrate measuring 10 cm×10 cm×1 mm thick (soda lime glass, Sekiya Rika Co., Ltd.). These were then thermocompression bonded using a thermal laminator (Test Laminator MRK-350Y, MCK Co., Ltd.) to fabricate an absorbent laminate. All heating rollers were set to a temperature of 140° C., roller pressure was set to 0.1 MPa and conveyance speed was set to 0.4 m/min.

A2. Peel Strength Evaluation Method

Peel strength (adhesive strength) between the substrate and absorbent film was measured with a tensile strength tester based on the 180 degree sign peel test described in JIS K6854-2. Here, a portion not subjected to thermocompression bonding equal to the width clamped by the tensile strength tester was provided in order to be clamped by the tensile strength tester, and a notch having a width of 15 mm was made in the absorbent film thermocompression bonded to the substrate. This portion of the thermocompression bonded portion having a width of 15 mm was pulled followed by measurement of peel strength between the substrate and absorbent film based on the 180° sign peel test described in JIS K68564-2 (N=5). Furthermore, the clamp movement speed was 100 mm/min.

A3. Peel Strength Evaluation Results

A3-1. Peel Strength of Absorbent Film Composed of Single Absorbent Layer to Substrate Absorbent laminates of Examples 1 to 3 and Comparative Examples 1 and 2 were fabricated by thermocompression bonding according to the method of the aforementioned section 1-3 using absorbent films composed of a single absorbent layer having different amounts of chemical adsorbent (calcium oxide: CaO) which were obtained according to the fabrication method of the aforementioned section 1-1. The amount of chemical adsorbent and results for peel strength of each example are shown in Table 1.

TABLE 1

| | CaO content in absorbent layer (wt %) | CaO volume percentage in absorbent layer (vol %) | Peel strength (N/15 mm) |
|---|---|---|---|
| Comparative Example 1 | 0 | 0 | No adhesion |
| Comparative Example 2 | 35 | 13 | No adhesion |
| Example 1 | 50 | 22 | 3.0 |
| Example 2 | 60 | 29 | 6.0 or more (film breakage) |
| Example 3 | 70 | 39 | 6.0 or more (film breakage) |

In Comparative Examples 1 and 2 the film spontaneously peeled from the substrate following thermocompression bonding and did not demonstrate adhesion. When the amount of calcium oxide was increased, adhesion of the film to the substrate by thermocompression bonding improved even if a resin binder was used that did not intrinsically adhere to the substrate, and an absorbent laminate was determined to be obtained in which the absorbent film was laminated to the substrate without having to perform adhesive processing by applying an adhesive and the like.

A3-2. Peel Strength of Absorbent Film Composed of Single Absorbent Layer to Substrate Depending on Thickness of Absorbent Film The absorbent laminates of Examples 4 to 7 were fabricated by changing the amount of chemical adsorbent and thickness of the absorbent film from those used in the fabrication method of the aforementioned section 1-1. The amount of chemical adsorbent, film thickness and results for peel strength of each example are shown in Table 2.

TABLE 2

| | CaO content in absorbent layer (wt %) | CaI volume percentage in absorbent layer (vol %) | Absorbent film thickness (μm) | Peel strength (N/15 mm) |
|---|---|---|---|---|
| Example 4 | 50 | 22 | 30 | 3.1 |
| Example 5 | 50 | 22 | 120 | 3.2 |
| Example 6 | 70 | 39 | 30 | 6.0 or more (film breakage) |
| Example 7 | 70 | 39 | 120 | 7.7 or more (film breakage) |

As indicated by the results of Examples 4 to 7 in the absorbent laminate of the present invention, the absorbent film was determined to adhere to the substrate with high peel strength regardless of the thickness of the absorbent film.

A3-3. Peel Strength of Absorbent Film having a 3-Layer Structure Provided with Skin Layers on Both Sides of Absorbent Layer to Substrate The absorbent laminates of Examples 8 to 10 and Comparative Examples 3 to 5 were fabricated by thermocompression bonding according to the method of the aforementioned section 1-3 using absorbent films obtained according to the fabrication method of the aforementioned section 1-2 and composed of a 3-layer structure having skin layers on both sides of the absorbent layer. The same resin as that of the skin layer was used for the binder resin of the absorbent layer for Comparative Example 3. In addition, the thickness of the skin layer located on the substrate side in Examples 11 and 12 was changed from that of Example 10. The compositions of the absorbent laminates and results for peel strength of each example are shown in Table 3.

TABLE 3

| | CaO content in absorbent layer (wt %) | CaO volume percentage in absorbent layer (vol %) | Thermoplastic resin binder of absorbent layer | Skin layer thickness (μm) | Peel strength (N/15 mm) |
|---|---|---|---|---|---|
| Comparative Example 3 | 0 | 0 | LLDPE | 10 | No adhesion |
| Comparative Example 4 | 0 | 0 | LDPE | 10 | No adhesion |
| Comparative Example 5 | 35 | 13 | LDPE | 10 | No adhesion |
| Example 8 | 50 | 22 | LDPE | 10 | 3.4 |
| Example 9 | 60 | 29 | LDPE | 10 | 8.0 or more (film breakage) |
| Example 10 | 70 | 39 | LDPE | 10 | 8.0 or more (film breakage) |
| Example 11 | 70 | 39 | LDPE | 30 | 12.5 |
| Example 12 | 70 | 39 | LDPE | 50 | 4.0 |

Peel strength became higher as calcium oxide content increased even in cases of having a skin layer, and peel strength exceeded film strength in Examples 9 and 10.

In addition, the highest value for peel strength was demonstrated in the case of a skin layer thickness of 30 μm. This is the result of the absorbent film not breaking during evaluation of peel strength due to the higher tensile strength of the absorbent film attributable to the thicker skin layer of Example 11 in comparison with Example 10. On the other hand, peel strength was determined to decrease if the thickness of the skin layer is 50 μm or more as in Example 12.

A3-4. Peel Strength of Absorbent Film to Substrate other than Glass Substrate

The absorbent laminates of Examples 13 to 15 were fabricated by changing the substrate used from that used in the absorbent laminate of Example 10. Furthermore, the compositions of the absorbent laminates and results for peel strength of each example are shown in Table 4.

TABLE 4

| | Type of substrate | Peel strength (N/15 mm) |
|---|---|---|
| Example 13 | Stainless steel (SUS430 sheet) | 8.0 or more (film breakage) |
| Example 14 | Aluminum (A5052 sheet) | 8.0 or more (film breakage) |
| Example 15 | Copper (C1100P sheet) | 8.0 or more (film breakage) |

Based on the above results, absorbent laminates having comparable peel strength were able to be fabricated under the same conditions as glass even when using these metal sheets for the substrate.

A4. Moisture Absorbency Test

In this test, the moisture absorbencies of the absorbent laminates (thermocompression bonded) of the aforementioned Examples 1 to 3 and the moisture absorbencies of the absorbent films (not thermocompression bonded) used to fabricate those absorbent laminates were compared to confirm the presence of an effect on moisture absorbency attributable to thermocompression bonding. In the case of the absence of thermocompression bonding, the absorbent films were placed on a wire mesh in a state in which both sides were exposed to the atmosphere. These absorbent films were then allowed to stand for 14 days in an environment at 40° C. and 90% RH followed by determination of the amount of moisture absorbed based on the change in weight thereof. Furthermore, there were no changes in the amounts of absorbed moisture and moisture absorbency became saturated if the absorbent films were allowed to stand beyond 14 days. The results are shown in the following Table 5.

TABLE 5

| CaO content in absorbent layer (wt %) | CaO volume percentage in absorbent layer (vol %) | Thermocompression bonding (laminate) (g/m²) | No thermocompression bonding (film layer only) (g/m²) |
|---|---|---|---|
| 50 | 22 | 15.0 | 15.3 |
| 60 | 29 | 18.5 | 18.3 |
| 70 | 39 | 21.2 | 21.4 |

On the basis of these results, there were no decreases in moisture absorbency even if thermocompression bonding was performed on the absorbent film, thereby making it possible to confirm that the absorbent laminate of the present invention maintains a high level of moisture absorbency.

A5. Test of Effect of Absorption on Coefficient of Expansion

The dimensions before and after moisture absorption of an absorbent film (not thermocompression bonded) fabricated in the same manner as in the aforementioned section A1-1, with the exception of changing the thickness to 100 μm, were compared with the dimensions before and after moisture absorption of an absorbent laminate (thermocompression bonded) obtained by performing thermocompression bonding according to the method of the aforementioned section A1-3 to confirm the effects of thermocompression bonding on expansion during moisture absorption by the absorbent film.

In this test, the absorbent films were first cut to a size of 10 cm x 10 cm followed by measurement of dimensions before moisture absorption. In the case of a thermocompression bonded laminate, the absorbent film was placed on an aluminum substrate having a thickness of 40 μm followed by hot-pressing the absorbent film and substrate using a thermal laminator (Test Laminator MRK-350Y, MCK Co., Ltd.). At this time, all heating rollers were set to a temperature of 140° C., roller pressure was set to 0.1 MPa and conveyance speed was set to 0.4 m/min. The absorbent film was placed on a wire mesh in a state in which both sides were exposed to the atmosphere.

The absorbent laminate and absorbent film were allowed to stand for 12 hours at 60° C. and 95% RH to saturate with absorbed moisture followed by again measuring their dimensions. Coefficient of area expansion was then determined using the following equation based on the measured dimensions.

Coefficient of area expansion=area after absorption/ area before absorption×100−100

The results are shown in the following Table 6.

TABLE 6

| | CaO weight percentage (wt %) | CaO volume percentage (vol %) | Film coefficient of area expansion |
|---|---|---|---|
| Absorbent laminate | 50 | 22 | 0.2 |
| | 60 | 29 | 0.3 |
| | 70 | 39 | 0.2 |
| Absorbent film only | 50 | 22 | 9.7 |
| | 60 | 29 | 12.8 |
| | 70 | 39 | 14.4 |

Furthermore, the absorbent film did not peel from the absorbent laminate even after having absorbed moisture. On the basis of the above results, thermal expansion in the planar direction was confirmed to be able to be inhibited in the case of thermocompression bonding the absorbent film to the substrate. Although each of the films demonstrated a similar degree of expansion as a result of absorbing moisture, the absorbent film expanded by a large amount in the direction of thickness in the absorbent laminate in which the coefficient of area expansion was inhibited.

Experiment B: Absorbent Laminates having Absorbent Layer Using Zeolite for Inorganic Absorption Agent B1. Absorbent Laminates Using Zeolite 3A for Inorganic Absorption Agent B1-1. Absorbent Laminates Using Glass Substrate The absorbent laminates described in Table 7 were obtained having a single absorbent layer absorbent film and glass substrate in the same manner as in the aforementioned section A1 with the exception of using zeolite 3A (Union Showa K.K., density: 1.37 g/cm³) for the inorganic absorption agent and changing the thickness to 100 μm (Comparative Examples 6 and 8, Examples 16, 18, 20, 22 and 24).

B1-2. Absorbent Laminates Using PET Substrate

The absorbent laminates described in Table 7 were obtained in the same manner as in section B1-1 with the exception of changing the glass substrate to a PET substrate having a thickness of 25 μm (E5100 Toyobo Co., Ltd.). Furthermore, although the aforementioned PET substrate was subjected to corona treatment on one side thereof, the absorbent film was thermocompression bonded to the untreated side of the PET substrate (Comparative Examples 7 and 9, Examples 17, 19, 21, 23 and 25).

These absorbent laminates were evaluated for peel strength in the same manner as in the aforementioned section A2. The evaluation results are shown in Table 7.

TABLE 7

| | Zeolite content (wt %) | Zeolite volume percentage (vol %) | Substrate | Peel strength (N/15 mm) |
|---|---|---|---|---|
| Comparative Example 6 | 0 | 0 | Glass | No adhesion |
| Comparative Example 7 | 0 | 0 | PET | No adhesion |
| Comparative Example 8 | 10 | 7 | Glass | No adhesion |
| Comparative Example 9 | 10 | 7 | PET | No adhesion |
| Example 16 | 20 | 14 | Glass | 0.1 or less |
| Example 17 | 20 | 14 | PET | 0.1 or less |
| Example 18 | 30 | 22 | Glass | 1.8 |
| Example 19 | 30 | 22 | PET | 1.8 |
| Example 20 | 50 | 40 | Glass | 4.9 or more (film breakage) |
| Example 21 | 50 | 40 | PET | 4.9 or more (film breakage) |
| Example 22 | 70 | 61 | Glass | 4.3 or more (film breakage) |
| Example 23 | 70 | 61 | PET | 4.3 or more (film breakage) |
| Example 24 | 80 | 72 | Glass | 2.3 or more (film breakage) |
| Example 25 | 80 | 72 | PET | 2.3 or more (film breakage) |

B1-3. Absorbent Laminates Changing only Thickness of Zeolite-Containing Absorbent Layer The absorbent laminates described in Table 8 were obtained in the same manner as the laminates of section B1-1 with the exception of changing the thickness of the absorbent film. However, LLDPE (Evolue® SP2520 Prime Polymer Co., Ltd., melt mass flow rate: 1.9 g/10 min, melting point: 122° C., density: 0.925 g/cm$^3$) was used for the thermoplastic resin binder in Comparative Examples 12 and 13.

These absorbent laminates were evaluated for peel strength in the same manner as in the aforementioned section A2. The evaluation results are shown in Table 8.

TABLE 8

| | Zeolite volume percentage (vol %) | Binder | Substrate | Absorbent film thickness (μm) | Peel strength (N/15 mm) |
|---|---|---|---|---|---|
| Comparative Example 10 | 0 | LDPE | Glass | 30 | No adhesion |
| Comparative Example 11 | 0 | LDPE | Glass | 250 | No adhesion |
| Comparative Example 12 | 0 | LLDPE | Glass | 30 | No adhesion |
| Comparative Example 13 | 0 | LLDPE | Glass | 250 | No adhesion |
| Example 26 | 14 | LDPE | Glass | 30 | 0.1 or less |
| Example 27 | 14 | LDPE | Glass | 250 | 0.1 or less |
| Example 28 | 61 | LDPE | Glass | 30 | 2.9 or more (film breakage) |
| Example 29 | 61 | LDPE | Glass | 250 | 9.3 or more (film breakage) |

B1-4. Absorbent Laminates Changing Thickness of PET Substrate

The absorbent laminates described in Table 9 were obtained in the same manner as the laminates of section B1-2 with the exception of changing the thickness of the PET substrate.

These absorbent laminates were evaluated for peel strength in the same manner as in the aforementioned section A-2. The evaluation results are shown in Table 9.

TABLE 9

| | Zeolite volume percentage (vol %) | Substrate | Substrate thickness (μm) | Peel strength (N/15 mm) |
|---|---|---|---|---|
| Comparative Example 14 | 7 | PET | 12 | No adhesion |
| Comparative Example 15 | 7 | PET | 50 | No adhesion |
| Comparative Example 16 | 7 | PET | 100 | No adhesion |
| Example 30 | 14 | PET | 12 | 0.1 or less |
| Example 31 | 14 | PET | 50 | 0.1 or less |
| Example 32 | 14 | PET | 100 | 0.1 or less |
| Example 33 | 22 | PET | 12 | 1.8 |
| Example 34 | 22 | PET | 50 | 1.7 |
| Example 35 | 22 | PET | 100 | 1.8 |
| Example 36 | 40 | PET | 12 | 7.4 or more (film breakage) |
| Example 37 | 40 | PET | 50 | 7.5 or more (film breakage) |
| Example 38 | 40 | PET | 100 | 7.4 or more (film breakage) |

B2-1. Absorbent Laminates Using Zeolite 4A and Zeolite 13X for Inorganic Absorption Agent The absorbent laminates described in Table 10 were obtained in the same manner as in section B1 with the exception of changing zeolite 3A to zeolite 4A (Union Showa K.K., density: 1.37 g/cm$^3$) or zeolite 13X (Union Showa K.K., density: 1.38 g/cm$^3$).

These absorbent laminates were evaluated for peel strength in the same manner as in the aforementioned section A2. The evaluation results are shown in Table 10.

TABLE 10

| | Zeolite volume percentage (vol %) | Type of zeolite | Substrate | Peel strength (N/15 mm) |
|---|---|---|---|---|
| Comparative Example 17 | 7 | 4A | Glass | No adhesion |
| Comparative Example 18 | 7 | 4A | PET | No adhesion |
| Comparative Example 19 | 7 | 13X | Glass | No adhesion |
| Comparative Example 20 | 7 | 13X | PET | No adhesion |
| Example 39 | 14 | 4A | Glass | 0.1 or less |
| Example 40 | 14 | 4A | PET | 0.1 or less |
| Example 41 | 14 | 13X | Glass | 0.1 or less |

TABLE 10-continued

| | Zeolite volume percentage (vol %) | Type of zeolite | Substrate | Peel strength (N/15 mm) |
|---|---|---|---|---|
| Example 42 | 14 | 13X | PET | 0.1 or less |
| Example 43 | 22 | 4A | Glass | 1.6 |
| Example 44 | 22 | 4A | PET | 1.7 |
| Example 45 | 22 | 13X | Glass | 1.9 |
| Example 46 | 22 | 13X | PET | 1.9 |
| Example 47 | 40 | 4A | Glass | 5.2 or more (film breakage) |
| Example 48 | 40 | 4A | PET | 5.2 or more (film breakage) |
| Example 49 | 40 | 13X | Glass | 5.1 or more (film breakage) |
| Example 50 | 40 | 13X | PET | 5.1 or more (film breakage) |
| Example 51 | 61 | 4A | Glass | 4.3 or more (film breakage) |
| Example 52 | 61 | 4A | PET | 4.3 or more (film breakage) |
| Example 53 | 61 | 13X | Glass | 3.9 or more (film breakage) |
| Example 54 | 61 | 13X | PET | 3.9 or more (film breakage) |

B2-2. Absorbent Laminates having Different Thermocompression Bonding Conditions

The absorbent laminates described in Table 11 were obtained in the same manner as Example 20 with the exception of changing the temperature of the heating rollers.

These absorbent laminates were evaluated for peel strength in the same manner as in the aforementioned section A-2. The evaluation results are shown in Table 11.

TABLE 11

| | Zeolite volume percentage (vol %) | Heating roller temperature (° C.) | Substrate | Peel strength (N/15 mm) |
|---|---|---|---|---|
| Comparative Example 21 | 40 | 100 | Glass | No adhesion |
| Example 55 | 40 | 110 | Glass | 1.2 |
| Example 56 | 40 | 120 | Glass | 4.4 |
| Example 57 | 40 | 130 | Glass | 4.9 or more (film breakage) |
| Example 58 | 40 | 140 | Glass | 4.9 or more (film breakage) |

B3. Absorbent Laminates Using Other Substrates

The absorbent laminates of Examples 59 to 61 were obtained in the same manner as Example 20 with the exception of changing the type of substrate. In addition, the absorbent laminates of Examples 62 to 69 and Comparative Examples 22 and 23 were obtained in the same manner as in section B1 with the exception of using a PET substrate having a vapor-deposited film on the side on which the absorbent film was not thermocompression bonded. Furthermore, product number 1510 manufactured by Toray Advanced Film Co., Ltd. was used for the Al-deposited PET, while GX Film manufactured by Toppan Printing Co., Ltd. was used for the silica-deposited PET.

These absorbent laminates were evaluated for peel strength in the same manner as in the aforementioned section A2. The evaluation results are shown in Table 12.

TABLE 12

| | Zeolite volume percentage (vol %) | Substrate | Peel strength (N/15 mm) |
|---|---|---|---|
| Example 59 | 40 | Stainless steel (SUS431 sheet) | 4.9 or more (film breakage) |
| Example 60 | 40 | Aluminum (A5052 sheet) | 4.8 or more (film breakage) |
| Example 61 | 40 | Copper (C1100P sheet) | 5.0 or more (film breakage) |
| Comparative Example 22 | 7 | Al-deposited PET | No adhesion |
| Comparative Example 23 | 7 | Silica-deposited PET | No adhesion |
| Example 62 | 14 | Al-deposited PET | 0.1 or less |
| Example 63 | 14 | Silica-deposited PET | 0.1 or less |
| Example 64 | 22 | Al-deposited PET | 1.9 |
| Example 65 | 22 | Silica-deposited PET | 1.7 |
| Example 66 | 40 | Al-deposited PET | 4.8 or more (film breakage) |
| Example 67 | 40 | Silica-deposited PET | 4.9 or more (film breakage) |
| Example 68 | 61 | Al-deposited PET | 4.3 or more (film breakage) |
| Example 69 | 61 | Silica-deposited PET | 4.3 or more (film breakage) |

B4. Test of Moisture Absorbency of Zeolite-Containing Absorbent Films

In this test, the moisture absorbencies of the absorbent laminates (thermocompression bonded) of the aforementioned Examples 16 to 23 and the moisture absorbencies of the absorbent films (not thermocompression bonded) used to fabricate those absorbent laminates were compared to confirm the effect of thermocompression bonding on moisture absorbency. Prior to thermocompression bonding, the absorbent films were placed on a wire mesh in a state in which both sides were exposed to the atmosphere. These absorbent films were then allowed to stand undisturbed in an environment at 40° C. and 90% RH until changes in weight were no longer observed followed by determination of the amount of moisture absorbed based on the change in weight thereof.

The results are shown in the following Table 13.

TABLE 13

| | Zeolite volume percentage (vol %) | Substrate | Thermocompression bonding (laminate) (g/m$^2$) | No thermocompression bonding (film layer only) (g/m$^2$) |
|---|---|---|---|---|
| Example 16 | 14 | Glass | 3.7 | 3.5 |
| Example 17 | 14 | PET | 3.6 | 3.5 |
| Example 18 | 22 | Glass | 5.9 | 5.9 |
| Example 19 | 22 | PET | 5.8 | 5.7 |
| Example 20 | 40 | Glass | 9.6 | 9.5 |
| Example 21 | 40 | PET | 9.6 | 9.6 |
| Example 22 | 61 | Glass | 13.8 | 13.7 |
| Example 23 | 61 | PET | 13.7 | 13.5 |

Experiment C. Measurement of Coefficients of Thermal Contraction of Substrate and Absorbent Film (1) Measurement Coefficient of Thermal Contraction of Absorbent Film The single absorbent layer absorbent films of Comparative Example 24 and Examples 70 and 71 described in Table 14 were fabricated in the same manner as in the aforementioned section A1 with the exception of using zeolite 3A (Union Showa K.K., density: 1.37 g/cm$^3$) for the inorganic absorption agent and changing the thickness to 100 μm. Moreover, the single absorbent layer absorbent films of Comparative Example 25 and Examples 72 and 73 described in Table 14 were obtained in the same manner as these absorbent films with the exception of using calcium oxide instead of zeolite 3A and changing the thickness to 60 μm.

The coefficients of thermal contraction of these absorbent films before and after thermocompression bonding were measured in the manner described below. First, the absorbent film was cut to a size of 10 cm×10 cm and a 5 cm and a benchmark line was drawn in the center thereof. The film was then placed between silicone-coated PET release films (thickness: 25 μm, SP-PET-01-25BU, Mitsui Chemicals Tohcello Inc.) on a glass substrate measuring 10 cm×10 cm×1 mm thick (strengthened glass, Sekiya Rika Co., Ltd.) and then hot-pressed using a thermal laminator (Test Laminator MRK-350Y, MCK Co., Ltd.). All heating rollers were set to a temperature of 140° C., roller pressure was set to 0.1 MPa and conveyance speed was set to 0.4 m/min. Furthermore, in this case, the absorbent film was not adhered to the silicone-coated PET release film. Elongation due to thermocompression bonding was measured by measuring the length of the benchmark line 10 seconds after performing thermocompression bonding, and contraction induced by cooling for 10 minutes in an environment at 23° C. was measured by measuring the benchmark line after cooling. The difference between elongation due to thermocompression bonding and contraction due to cooling was taken to be the amount of thermal contraction. In addition, the value obtained by dividing the amount of thermal contraction by the length of the benchmark line used as a reference (5 cm) was taken to be the coefficient of thermal contraction.

Moreover, absorbent laminates were obtained by thermocompression bonding these absorbent films and glass substrates under the same conditions as the aforementioned hot pressing with the exception of not using a silicone-coated PET release film. The peel strengths of these absorbent laminates were then measured in the same manner as in the aforementioned section A2.

The results are shown in the following Table 14.

TABLE 14

| | Absorp. agent | Absorp. agent volume percent. (vol %) | Film Thick. (μm) | Dimensions (mm) | | | Amount of thermal cont. (mm) | Coeff. of thermal cont. (%) | Peel strength (N/15 mm) |
| --- | --- | --- | --- | --- | --- | --- | --- | --- | --- |
| | | | | Before treat. | 10 s after treat. | 10 min after treat. | | | |
| Comp. Ex. 24 | Zeolite 3A | 7 | 100 | 99.9 | 102.6 | 100.5 | 2.1 | 4.2 | No adhesion |
| Ex. 70 | | 14 | 100 | 100.1 | 102.3 | 100.7 | 1.6 | 3.2 | 0.1 or less |
| Ex. 71 | | 61 | 100 | 100.0 | 100.5 | 100.0 | 0.5 | 1.0 | Film breakage |
| Comp. Ex. 25 | Calcium oxide | 13 | 60 | 100.0 | 102.6 | 100.5 | 2.1 | 4.2 | No adhesion |
| Ex. 72 | | 22 | 60 | 100.1 | 102.1 | 101.2 | 0.9 | 1.8 | 3.0 |
| Ex. 73 | | 39 | 60 | 100.1 | 100.1 | 100.8 | 0.3 | 0.6 | Film breakage |

(2) Measurement of Amount of Thermal Contraction of Substrate

The amounts of thermal contraction and coefficients of thermal contraction were measured in the manner described below for various individual PET substrates, a silica-deposited PET substrate (GX Film, Toppan Printing Co., Ltd.) and an alumina-deposited PET substrate (GL Film, Toppan Printing Co., Ltd.). The film substrates of Reference Examples 1 to 6 were cut to a size of 10 cm×10 cm and a 5 cm benchmark line was drawn in the center thereof. The film substrates were placed on glass substrates and hot-pressed with a thermal laminator. Furthermore, in this case, the film substrates were not adhered to the glass substrates. Here, hot pressing conditions consisted of a temperature of 140° C. for all heating rollers, roller pressure of 0.1 MPa and conveyance speed of 0.4 m/min.

Moreover, the amounts of thermal contraction and coefficients of thermal contraction were also measured in the same manner for thermoplastic resin binders in the form of individual LLDPE (Evolue® SP2520 Prime Polymer Co., Ltd.) and LDPE (Petrothene 202R, Tosoh Corp.) films for reference purposes (Reference Examples 7 and 8).

TABLE 15

| | Substrate/film type | Thick. (μm) | Absorp. agent volume percent. (vol %) | Dimensions (mm) Before treat. | 10 s after treat. | 10 min after treat. | Amount of thermal cont. (mm) | Coeff. of thermal cont. (%) |
|---|---|---|---|---|---|---|---|---|
| Ref. Ex. 1 | PET | 12 | 0 | 100.0 | 100.0 | 100.0 | 0.0 | 0.0 |
| Ref. Ex. 2 | | 25 | 0 | 100.3 | 100.3 | 100.3 | 0.0 | 0.0 |
| Ref. Ex. 3 | | 50 | 0 | 100.2 | 100.2 | 100.2 | 0.0 | 0.0 |
| Ref. Ex. 4 | | 100 | 0 | 100.1 | 100.1 | 100.1 | 0.0 | 0.0 |
| Ref. Ex. 5 | Silica-deposited PET | 12 | 0 | 100.0 | 100.0 | 100.0 | 0.0 | 0.0 |
| Ref. Ex. 6 | Al-deposited PET | 12 | 0 | 100.1 | 100.1 | 100.1 | 0.0 | 0.0 |
| Ref. Ex. 7 | LLDPE | 100 | 0 | 100.0 | 103.8 | 102.0 | 1.8 | 3.6 |
| Ref. Ex. 8 | LDPE | 100 | 0 | 99.9 | 103.7 | 101.7 | 2.0 | 4.0 |

BRIEF DESCRIPTION OF THE REFERENCE SYMBOLS

1 Absorbent layer
2 Substrate
3 Skin layer
10 Absorbent laminate
20 EL element
21 Metal electrode
22 EL layer
23 Transparent electrode
24 TFT
25 Transparent substrate
31 Heating roller
32 Conveyance roller

The invention claimed is:

1. An absorbent laminate containing a substrate, having an inorganic material or a low-thermal-contraction organic material on the surface thereof, and an absorbent film on the surface of the substrate,
wherein the organic material of the substrate has a coefficient of thermal contraction in the direction of conveyance of less than 0.6% when it is hot pressed with a heating roller under conditions of 140° C., a roller pressure of 0.1 MPa and a conveyance speed of 0.4 m/min, and
wherein the absorbent film is adhered to the surface of the substrate without having an adhesive layer there between, and has an absorbent layer containing less than 87 vol % to 25 vol % or more of a thermoplastic resin binder and more than 13vol % to 75 vol % or less of an inorganic absorption agent.

2. An absorbent laminate in which the surface of a substrate having an inorganic material or low-thermal-contraction organic material on the surface thereof and an absorbent film are adhered by thermocompression bonding treatment without having an adhesive layer there between,
wherein the organic material has a coefficient of thermal contraction in the direction of conveyance of less than 0.6% when it is hot pressed with a heating roller at the same temperature as that of the thermocompression bonding treatment under conditions of a roller pressure of 0.1 MPa and a conveyance speed of 0.4 m/min, and
wherein the absorbent film has an absorbent layer containing less than 87 vol % to 25 vol % or more of a thermoplastic resin binder and more than 13 vol % to 75 vol % or less of an inorganic absorption agent.

3. The absorbent laminate described in claim 1, wherein the surface of the substrate contains a material selected from the group consisting of polyethylene terephthalate, glass, iron and alloys thereof, aluminum and alloys thereof and copper and alloys thereof.

4. The absorbent laminate described in claim 1, wherein the surface of the substrate has glass or metal, and the absorbent layer contains less than 87 vol % to 50 vol % or more of a thermoplastic resin binder and more than 13 vol % to 50 vol % or less of a chemical adsorbent.

5. The absorbent laminate described in claim 1, wherein the inorganic absorption agent is selected from the group consisting of calcium oxide, magnesium oxide, barium oxide, calcium sulfate, titanium sulfate, alumina, aluminum oxide, magnesium silicate, quicklime, silica gel, aluminosilicate minerals, clay, porous glass, microporous activated carbon, zeolite, activated carbon and mixtures thereof.

6. The absorbent laminate described claim 1, wherein the thermoplastic resin binder is a polyolefin-based resin.

7. The absorbent laminate described in claim 1, wherein the absorbent film has a skin layer composed of a resin and having a thickness of 60 μm or less on the substrate side of the absorbent layer.

8. A method for producing an absorbent laminate according to claim 2, containing a substrate having an inorganic material and low-thermal-contraction organic material on the surface thereof and an absorbent film on the surface of the substrate, comprising:
providing the substrate,
providing an absorbent composition containing less than 87 vol % to 25 vol % or more of a thermoplastic resin binder and more than 13 vol % to 75 vol % or less of an inorganic absorption agent, and
obtaining the absorbent film by forming the absorbent composition and thermocompression bonding the absorbent film to the surface of the substrate without having an adhesive layer there between;

wherein the organic material has a thermal compression rate in the direction of conveyance of less than 0.6% when it is hot pressed with a heating roller at the same temperature as that of the thermocompression bonding under conditions of a roller pressure of 0.1 MPa and a conveyance speed of 0.4 m/min.

9. The method for producing an absorbent laminate described in claim 8, wherein the substrate contains a material selected from the group consisting of polyethylene terephthalate, glass, iron and alloys thereof, aluminum and alloys thereof and copper and alloys thereof, the thermoplastic resin binder is a polyolefin-based resin, and the inorganic absorption agent is selected from calcium oxide, zeolite and mixtures thereof.

10. A method for producing a laminate, containing a substrate having glass or metal on the surface thereof and an absorbent film, comprising:

providing the substrate having glass or metal on the surface thereof, providing an absorbent composition containing less than 87 vol % to 25 vol % or more of a thermoplastic resin binder and more than 13 vol % to 75 vol % or less of an inorganic absorption agent, and obtaining the absorbent film by forming the absorbent composition and thermocompression bonding the absorbent film to the substrate.

11. An electronic device containing the absorbent laminate described in claim 1.

12. The electronic device described in claim 11, which is an organic EL module, an inorganic EL module or a solar cell.

* * * * *